United States Patent
Lee et al.

(10) Patent No.: US 8,176,370 B2
(45) Date of Patent: May 8, 2012

(54) METHOD AND SYSTEM FOR DIRECT ACCESS MEMORY TESTING OF AN INTEGRATED CIRCUIT

(75) Inventors: Jonathan Lee, Dublin, CA (US); Xiaogang Zhu, Fremont, CA (US); Andrew S. Hwang, Redondo Beach, CA (US)

(73) Assignee: Broadcom Corporation, Irvine, CA (US)

( * ) Notice: Subject to any disclaimer, the term of this patent is extended or adjusted under 35 U.S.C. 154(b) by 1966 days.

(21) Appl. No.: 10/940,146

(22) Filed: Sep. 13, 2004

(65) Prior Publication Data

US 2005/0060621 A1 Mar. 17, 2005

Related U.S. Application Data

(60) Provisional application No. 60/502,588, filed on Sep. 12, 2003.

(51) Int. Cl.
*G11C 29/00* (2006.01)
(52) U.S. Cl. .................................. 714/718; 714/744
(58) Field of Classification Search .................. 714/718; 365/200, 201
See application file for complete search history.

(56) References Cited

U.S. PATENT DOCUMENTS

| | | | | |
|---|---|---|---|---|
| 4,724,531 A * | 2/1988 | Angleton et al. | ............. | 365/181 |
| 4,942,556 A * | 7/1990 | Sasaki et al. | .................. | 365/200 |
| 5,751,729 A * | 5/1998 | Aybay | ............................ | 714/718 |
| 6,233,182 B1 * | 5/2001 | Satou et al. | ................... | 365/200 |
| 6,263,461 B1 * | 7/2001 | Ayres et al. | .................... | 714/718 |
| 6,317,846 B1 * | 11/2001 | Higgins et al. | ................... | 714/30 |
| 6,438,044 B2 * | 8/2002 | Fukuda | .......................... | 365/200 |
| 6,865,701 B1 * | 3/2005 | Youngs et al. | ................ | 714/718 |
| 2004/0139377 A1 * | 7/2004 | Barnhart et al. | ............... | 714/726 |

* cited by examiner

*Primary Examiner* — Jeffrey A Gaffin
*Assistant Examiner* — Steve Nguyen
(74) *Attorney, Agent, or Firm* — Thomas, Kayden, Horstemeyer & Risley LLP.

(57) ABSTRACT

Aspects of the invention may be found in a method and system for testing an integrated circuit and may comprise an address selector, data selector and staging register coupled to a signal generator. The address selector may comprise a direct access memory test (DAMT) mode address control input and one or more output address pins coupled to an embedded memory device under test (DUT). The data selector may be coupled to at least one data pin and control pin of the signal generator and may comprise a DAMT mode data control input and at least one data output coupled to embedded memory DUT. A staging register comprising a first output clock rate which is one-quarter (¼) its input clock rate and matches a DUT burst write frequency may be coupled to an input of the data selector. A DAMT mode control may configure the memory DUT for DAMT operation.

32 Claims, 3 Drawing Sheets

METHOD AND SYSTEM FOR DIRECT ACCESS MEMORY TESTING OF AN INTEGRATED CIRCUIT

CROSS-REFERENCE TO RELATED APPLICATIONS/INCORPORATION BY REFERENCE

This application makes reference to, claims priority to and claims the benefit of U.S. Provisional Application Ser. No. 60/502,588 filed Sep. 12, 2003.

The above stated application is incorporated herein by reference in its entirety.

FIELD OF THE INVENTION

Certain embodiments of the invention relate to testing of integrated circuits. More specifically, certain embodiments of the invention relate to a method and system for testing an integrated circuit.

BACKGROUND OF THE INVENTION

Advancement in chip technology has resulted in the development of embedded processors and controllers. Embedded processors and/or controllers may include microprocessor and/or microcontroller circuitry that has been integrated into single package containing associated companion logic and peripherals. Embedded processors differ from microprocessors and microcontrollers in that microprocessors and microcontrollers are typically coupled with associated logic on a circuit board to implement a specified application.

Further advancements in chip technology have increased packaging density to the point where it is now possible implement a standalone application on a single chip. In this regard, the resulting integrated circuit (IC) is called a system on a chip (SoC). A SoC may include one or more microprocessor and/or microcontroller elements, peripherals, associated logic and memory all fabricated on a densely packaged IC. For example, a SoC for a broadband set-top box may include a receiver, a transmitter, a digital signal processor, one or more encoders and decoders, random access memory (RAM), and non-volatile memory (NVM), all of which may be integrated on a single chip. The peripherals are typically called embedded peripherals. In the case of a memory element, the memory element may be called an embedded memory.

Due to the ubiquitous use of integrated circuits in electronic devices and systems, testing of such integrated circuits in the fabrication process must be accomplished to ensure an effective production yield. In particular, testing is of importance in integrated circuits (ICs) that incorporate embedded memories. Embedded memories may be tested using a built-in self test (BIST) controller, for example, that supplies a series of pre-determined test patterns to one or more embedded memories.

The built-in self test controller is implemented using a number of gates and is incorporated into an integrated circuit (IC) during manufacturing. The built-in self test controller operates by supplying a number of input test patterns to components within the integrated circuit which are referred to as the device under test (DUT). The device under test may generate an output signal which corresponds to the input test pattern. In order to evaluate the performance of the integrated circuit, the output signal generated by the device under test may subsequently be compared against a set of expected test signal responses corresponding to the input test pattern.

A built-in self test controller utilizes selected built-in test patterns that cover a majority of the possible memory failure scenarios. Accordingly, the BIST test patterns for an integrated circuit are manufactured into or permanently burned into the chip prior to commercial usage. Accordingly, if there are any design changes in hardware and/or firmware, new test patterns cannot be readily implemented. Furthermore, the BIST circuitry and logic may utilize expensive chip real estate.

The packing density of an integrated circuit may further affect the testing of embedded memories, for example, read-only memory (ROM) and random access memory (RAM) such as dynamic RAM (DRAM), static RAM (SRAM), and dual-data rate RAM (DDR). In the case of integrated circuits that contain a small number of embedded memories and are therefore less densely packed, the use of built-in self test technology may not be advantageous. In this regard, the implementation of a built-in self test controller circuitry within each integrated circuit may not be desirable since the overall cost to implement testing increases with each unit of product manufactured.

Although built-in self test technology provides a significant role in a component level test where access to the embedded virtual component is difficult or impossible, there exists associated drawbacks or disadvantages that may result in designers utilizing alternative approaches to testing embedded devices such as embedded memory. For example, a significant amount of additional circuitry or logic is generally required to implement the built-in self test controller. Also, the number of gates used to realize a built-in self test controller may be in the tens of thousands. As a consequence, in certain instances, it may be beneficial to rely on secondary modes of testing.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for testing an integrated circuit. Aspects of the method may comprise configuring a memory device under test to operate in a direct access memory test mode. The memory device under test may be a device that is embedded within the integrated circuit. An address selector and/or a data selector may be configured to operate in direct access memory test mode. Test data may be clocked into the memory device under test at a first data rate. The test data may be staged in a staging register prior to being clocked into the memory device. The test data that is staged in the staging register may be clocked into the staging register at a second data rate, wherein the second data rate is about four times (4×) the first data rate (1×). At least a first clock signal may be supplied to the memory device under test. At least a second clock signal may be supplied to the staging register, wherein the second clock signal has a clock rate which is about four times (4×) a clock rate of the first clock signal (1×). In this regard, the first clock signal is adapted to match a burst memory write frequency of the memory device under test.

Resulting test data may be transferred out of the memory device under test for analysis. Accordingly, this may comprise clocking the resulting test data out of the memory device under test at a suitable data or clock rate. At least a portion of the resulting test data may be compared to a corresponding portion of expected data results. A status of the memory device under test may then be reported as being good or defective and/or pass or fail.

In another embodiment of the invention, during the direct access memory test mode, a limited number of external pins of a test device or test fixture may be mapped to a corresponding data bus width of the integrated circuit having the embedded memory device under test. Also, during the direct access memory test mode, at least a remaining portion of the limited number of external pins of the test device may be mapped to a corresponding address bus width of the integrated circuit. At least a remaining portion of the limited number of external pins of the test device may be mapped to a corresponding data bus width of the integrated circuit with the embedded memory device under test. At least a portion of the limited number of external pins of the test device may be configured as a data input, a data output and/or a data I/O pin. At least a portion of the limited number of external pins of the test device may also be configured as first clock signal and/or a second clock signal.

Aspects of the system for testing an integrated circuit may comprise a signal generator that generates a signal that configures a memory device under test to operate in a direct access memory test mode. The memory device under test may be embedded within the integrated circuit. An address selector configurable by the signal generator may be configured to operate in the direct access memory test mode. A data selector configurable by the signal generator may also be configured to operate in a direct access memory test mode. The signal generator may clock test data into the memory device under test at a first data rate. A staging register may be adapted to stage the test data prior to it being clocked into the memory device under test. The signal generator may be adapted to clock the test data into the staging register at a second data rate which is about four times (4×) the first data rate (1×). The signal generator may be adapted to supply at least a first clock signal to the memory device under test.

The signal generator may be adapted to supply at least a second clock signal to the staging register, wherein the second clock signal has a clock rate which is about four times (4×) a clock rate of the first clock signal (1×). In this regard, the clock rate of the first clock signal matches a burst memory write frequency of the memory device under test. The signal generator may also generate at least one signal that may transfer the resulting test data out of the memory device under test for subsequent analysis. The signal generated by the signal generator may also be configured to clock the resulting test data out of the memory device under test. At least one comparator may be adapted to compare at least a portion of the resulting test data with at least a portion of expected test data. Based on the comparison, the comparator may report a status of the memory device under test as being, for example, good or defective and/or pass or fail.

In accordance with an embodiment of the invention, the signal generator may map a limited number of external pins of a test device to a corresponding data bus width of the integrated circuit with the embedded memory device under test during direct access memory test mode. At least a remaining portion of the limited number of external pins of the test device may be mapped by the signal generator to a corresponding address bus width of the integrated circuit with the embedded memory device under test. At least a remaining portion of the limited number of external pins of the test device may also be mapped by the generator to a corresponding data bus width of the integrated circuit with the embedded memory device under test. The signal generator may configure at least a portion of the limited number of external pins of the test device as data input pins, data output pins and/or data I/O pins. Notwithstanding, the signal generator may configure at least a portion of the limited number of external pins of the test device as a first clock signal and/or a second clock signal.

Another embodiment of the invention may also provide a system for testing an integrated circuit. Aspect of the system may comprise an address selector coupled to at least one address pin and at least one control pin of a signal generator. The address selector may comprise a direct access memory test mode address control input and at least one output address pin coupled to an embedded memory device under test. A data selector may be coupled to at least one data pin and at least one control pin of the signal generator. The data selector may also have a direct access memory test mode data control input and at least one output data pin coupled to the embedded memory device under test. At least one staging register may be coupled to at least one input of the data selector. The staging register may comprise a first output clock rate which is one-quarter (¼) its input clock rate. The signal generator may generate a direct access memory test mode control signal which may function as an input to the memory device under test and which may configure the memory device under test to operate in a direct access memory test mode. The signal generator may also generate at least a first clock signal which functions as an input to the memory device under test and a second input clock signal which may function as an input to a staging register. A clock rate of the first clock signal is adapted so that it matches a burst memory write frequency of the memory device under test. A clock rate of the second input clock signal is about four times (4×) the clock rate of the first clock signal (1×). The system may further comprise a comparator that receives output test data from the memory device under test and generates a status condition of the memory device under test.

These and other advantages, aspects and novel features of the present invention, as well as details of an illustrated embodiment thereof, will be more fully understood from the following description and drawings.

DETAILED DESCRIPTION OF THE INVENTION

Figure 1:
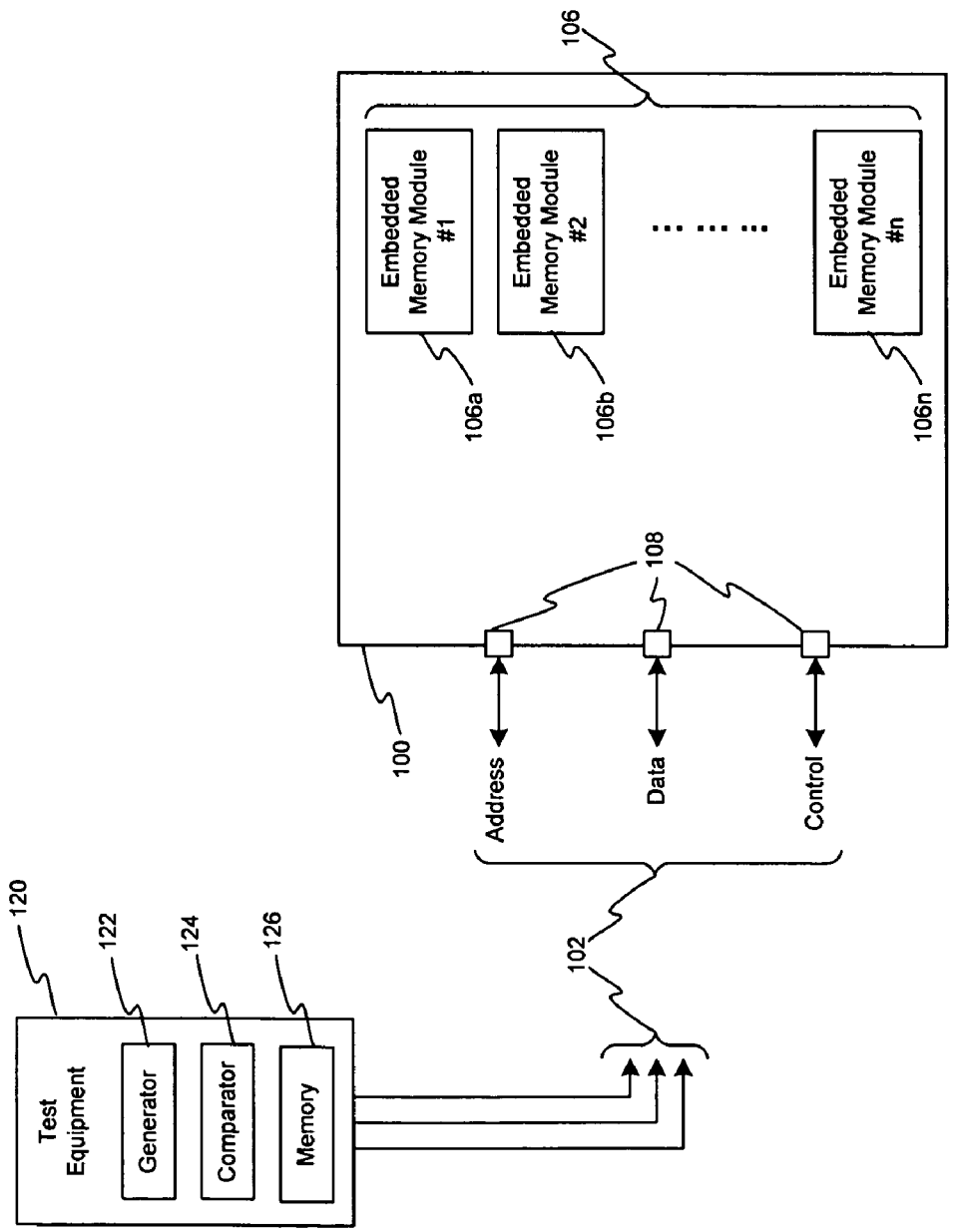
FIG. 1 is a block diagram of an integrated circuit that may be utilized in connection with a direct access memory testing (DAMT) mode in accordance with an embodiment of the invention.

Aspects of the present invention may be found in a method and system for testing integrated circuits by receiving test patterns by the integrated circuit by way of the integrated circuit's external pins or pads. The integrated circuits may comprise a plurality of embedded memories. A number of test patterns or signals are used to assess the performance of one or more components within the integrated circuit. After the one or more test patterns are received and processed, the outputs of the components may be transmitted back to a test device or fixture for analysis. The external device may comprise a signal analyzer, a test pattern analyzer or a personal computer.

Integrated circuits such as memory devices or SOCs may comprise one or more embedded memories that may be tested by way of at least one external test pattern generator that provides the test patterns to the integrated circuit's external pins. The test patterns may be written or otherwise transferred into the embedded memories by way of direct access memory testing in accordance with an embodiment of the invention. Direct access memory testing may utilize, for example, an external test fixture that may be adapted to supply exemplary test patterns via test signals to the integrated circuit by way of its external pins. Data may then be read out of the integrated circuit by way of the external pins and may be compared with various expected results. The test signals may comprise data, address and control signals.

In accordance with an aspect of the invention, direct access memory testing may provide an alternative to conventional memory testing methods. For example, direct access memory testing may provide a more desirable approach compared with a built-in self test approach in various instances. Implementation of the direct access memory testing may be desirable when the integrated circuit presents a perimeter capable of providing a sufficient number of external pins. These external pins are utilized to implement the direct access memory test and may be mapped so that they are sufficient to address the embedded memory devices within the integrated circuit in which testing are to be performed. In addition, a number of pins may be utilized to transmit and receive one or more test patterns generated by a test pattern generator or test equipment. Since the number of external pins required may increase proportionally with the amount of memory tested within an integrated circuit, implementation of the direct access memory testing mode may be highly advantageous for integrated circuits that have smaller amounts of embedded memory, for example. Furthermore, integrated circuits with, for example, low to medium core speed may be suitable for direct access memory testing compared with a built-in self test mode. In certain circumstances, the use of direct access memory testing in addition to an alternate mode, such as a built-in self test mode may be desirable. In this regard, direct access memory testing may be utilized to supplement and/or complement the use of the built-in self test for testing an integrated circuit.

FIG. 1 is a block diagram of an integrated circuit 100 that may be utilized in connection with a direct access memory testing (DAMT) mode in accordance with an embodiment of the invention. Referring to FIG. 1, there is shown an integrated circuit 100, a plurality of input signals collectively referenced as 102 and a plurality of embedded memory modules collectively referenced as 106. The input signals 102 may comprise an address signal, a data input signal and an input control signal. The embedded memory modules 106 may comprise a first memory module 106a, a second memory module 106b, . . . , and an n$^{th}$ memory module 106n. Pads on the periphery of the integrated circuit 100 provide an interface for coupling the input signals 102 to the integrated circuit.

FIG. 1 also illustrates an exemplary automated test equipment 120 comprising a generator 122, a comparator 124 and memory 126. The generator 122 may be adapted to generate test signals comprising test patterns which may be provided to the integrated circuit 100 via the pads 108 to the device under test. The comparator 124 may be adapted to receive resultant output signals from the device under test and compare the resultant output signals to an expected output signal. Memory 126 may be adapted to store expected results and/or resulting output signals that are clocked out of the embedded memory device under test during testing. Any discrepancy between the resultant output signals from the device under test and the expected output signal may be reported. Based on the report, a pass/fail status or defective/good status may be assigned to the device under test. Additionally, an address or other identifier of a location of a failed or defective device or memory location may be reported.

In certain instances, a device under test may fail but the failing device under test may be disabled. In this regard, depending on the number of failed devices under test that may be found within an integrated circuit, the integrated circuit may still be designated as being good. For example, if less that 0.05% of the devices under test fail, an integrated circuit may still be designated as being good since the failed portions of the device under test may be disabled. However, if more that 0.05% of the devices under test fail, then the integrated circuit may be designated as being wholly defective. This threshold percentage may be randomly selected.

Referring to FIG. 1, during operation, the test equipment 120 may generate the signals 102 comprising address, data and control signals, which may be communicated to the integrated circuit 100 via the pads 108. The address signals may be utilized to address a particular device under test within the integrated circuit. The data signal may contain the test patterns that may be utilized to generate the test patterns. The control signal may comprise, for example, clock signals that may facilitate clocking in or loading the bit patterns into the device under test. The control signals may also be utilized to clock resultant output signals out of the device under test and back to the test equipment via the pads 108.

Figure 2:
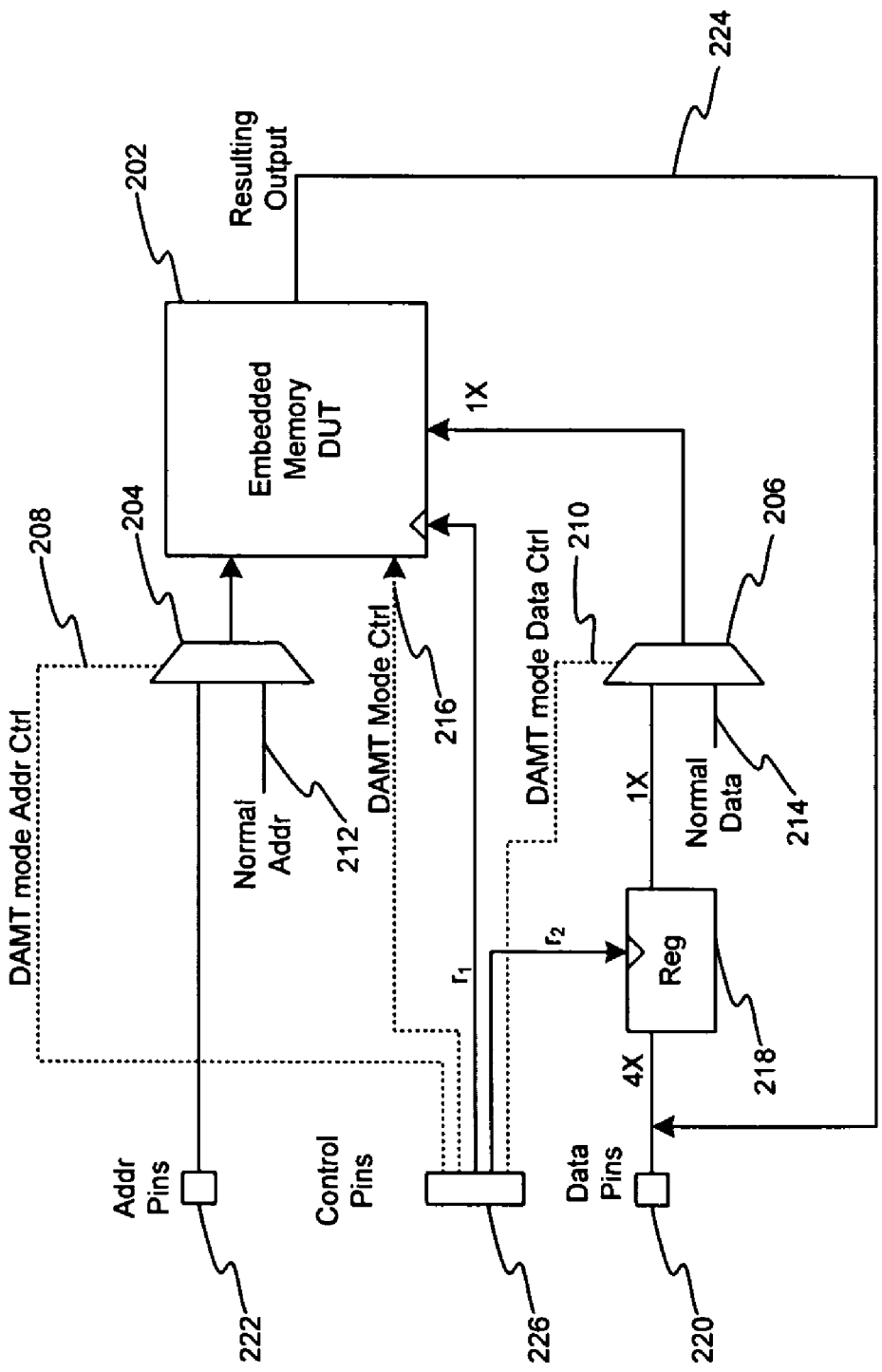
FIG. 2 is a block diagram of an exemplary system that may be utilized for direct access memory testing in accordance with an embodiment of the invention.

FIG. 2 is a block diagram of an exemplary system that may be utilized for direct access memory testing in accordance with an embodiment of the invention. Referring to FIG. 2, the exemplary system may comprise an embedded memory device under test 202, a first selector 204, a second selector 206, a staging register 218, data pins 220, address pins 222, and control pins 226. The control pins 226 may comprise a plurality of clock and control signals. The signals may comprise a direct access memory test address control signal 208, a direct access memory test mode control signal 216 and a direct access memory test data control signal 210.

The first selector 204 may be referred to as an address selector since it is adapted to select address signals from the address pins 222. The address selector 204 may be a multiplexer having a plurality of inputs for handling the address pins 222 and normal address signals 212 that are utilized when the embedded memory device under test is not being tested. The direct access memory test mode address control signal 208 may function as an input to the address selector 204 and may be utilized to select between the address pin signals 222 and the normal address signal 212. Consequently, during direct access memory testing, the address pins input 222 to the address selector 204 is active while the normal address input 212 is inactive. During normal operating mode, the reverse is true and the address pins input 222 to the address selector 204 is inactive while the normal address input 212 is active.

The second selector 206 may be referred to as a data selector since it is adapted to select data signals from the data pins 220. The data selector 206 may be a multiplexer having a plurality of inputs for handling the data pins 220 and normal data signals 214 that are utilized when the embedded memory device under test is not being tested. The direct access memory test mode data control signal 210 may function as an input to the data selector 206 and may be utilized to select between the data pin signals 220 and the normal data signal 214. Consequently, during direct access memory testing, the data pins input 220 to the data selector 206 via the staging register 218 is active while the normal data input 214 is inactive. During normal operating mode, the reverse is true and the data pins input 220 to the data selector 206 is inactive while the normal data input 214 is active.

The control pins 226 may be adapted to supply clock signals, which may be provided to, for example, the staging register 218 and/or the memory device under test 202. For example, a first clock signal may be provided to the embedded memory device under test 202 at a clock rate $r_1$ and a second clock signal may be provided to the staging register 218 at a clock rate of $r_2$. In an aspect of the invention, the clock rate $r_2$ may be about four (4×) times the clock rate of $r_1$, which may be represented as 1×. The first clock signal and the second clock signal may be generated or supplied by the test equipment or fixture 120 of FIG. 1.

The direct access memory test mode control signal 216 is coupled to the embedded memory device under test 202. In this regard, the direct access memory test mode control signal 216 may be utilized to configure the embedded memory device under test 202 for operation in a direct access memory test mode.

In operation, the memory device under test, for example, the embedded memory device under test 202, may be enabled to operate in a direct access memory test mode. In this regard, the direct access memory test mode control signal 216 may be asserted in order to place the embedded memory device under test 202 into the direct access memory test mode. The first selector or multiplexer 204 may be enabled to select the address pins 222 as inputs and disable the normal address input signal 212. In this regard, the direct access memory test mode address control signal 208 may be asserted in order to enable the address pins 222 as inputs and disable the normal address signals 212. Once the address pins are enabled, the address signals may be utilized to locate and target the embedded memory device under test 202.

The second selector or data selector 206 may be enabled to select the data pins 220 as data inputs to the data selector 206 via the staging register 218. While the input data pins 220 are selected as inputs to the data selector 206 via the staging register 218, the normal data input signal 214 to the data selector 206 may be disabled. The direct access memory test mode data control signal 210 may be asserted in order to enable the data pins 220 as active inputs to the data selector 206 and disable the normal data signals 214. At this point, the address selector 204, the data selector 206 and the embedded memory device under test 202 are now configured for direct access memory test mode.

Test data may then be clocked into the staging register 218 via the data pins 220. The staging register 218 may be configured as a parallel register that may be adapted to buffer the input test data prior to transferring the input test data to the embedded device under test 202. The test data may be clocked into the embedded memory device under test 202 at a rate that matches a burst write frequency of the embedded memory device under test 202. Clocking the test data at a rate that matches a burst write frequency of the embedded memory device under test 202 may ensure that any transitional faults that may occur are fully covered. The input test data may be clocked into the staging register 218 at a first clock rate. Accordingly, the input test data buffered in the staging register 218 may be clocked out of the staging register 218 and into the embedded memory device under test 202 at a second data clock rate. The second clock rate may be adapted to match a burst write frequency of the embedded memory device under test 202.

In an illustrative embodiment of the invention, the data pins may comprise a data width of 32 bits. In other words, the data bus width is 32 bits wide. Notwithstanding, the data bus width on the output side of the data selector 206 may be 128 bits wide. Accordingly, data may be clocked into the staging register 218 at a rate of four times (4×) the rate at which data is clocked out of the staging register 218 into the embedded memory device under test 202.

The address pins 222 may be adapted to control the memory locations in the embedded memory block 202 to which test data is written. The test pattern that may be written into the various locations of the embedded memory device under test 202 may be read back and clocked out of the embedded memory device under test 202 at a suitable rate such as 1×, 2× or 4×. In one embodiment of the invention, resulting data read from the embedded memory device under test 202 may be transferred via path 224 back to the data pins 220. The test fixture or equipment 120 of FIG. 1 which may be coupled to the data pins 220 may receive and store the resulting output data clocked out of the device under test 202. For example, the test fixture or equipment 120 of FIG. 1 which is coupled to the data pins 220 may receive and store the resulting output data clocked out of the embedded memory device under test 202. In this regard, the resulting output data clocked out of the embedded memory device under test 202 may be stored in the memory 126 of the test fixture or equipment 120.

Resulting output data stored in the memory 126 may be compared to expected results that correspond to the input test data. The expected test results may also be stored in the memory 126. If the resulting output matches the expected results, then the device under test may be reported as having passed the test and/or being good. If at least a portion of the resulting output data does not match the expected results, then the device under test may be reported as having failed the test and/or being defective.

During the direct access memory test, a battery of tests may be performed during which a plurality of various bit patterns may be utilized for testing an embedded memory device under test. For example, a walking ones "1s" pattern and/or a walking zeros "0s" pattern may be utilized for testing the memory device under test. The following table illustrates and exemplary walking ones "1s" pattern that may be utilized for testing the device under test.

| Mem. Loc | Pattern |
|---|---|
| 1 | 00000001 |
| 2 | 00000010 |
| 3 | 00000100 |
| 4 | 00001000 |
| 5 | 00010000 |
| 6 | 00100000 |
| 7 | 01000000 |
| 8 | 10000000 |

In the walking ones "1s" pattern a first memory location may be tested by writing test pattern 00000001 into the first memory location. A second memory location which is consecutive to the first memory location may be tested by writing test pattern 00000010 into the second memory location. A third memory location which is consecutive to the second memory location may be tested by writing test pattern 00000100. These patterns for testing successive memory locations as shown may be followed for successive patterns. When the eighth memory location is reached, test pattern 10000000 is written to the eighth memory location. The test patterns may then be repeated for successive memory locations. For example, for the ninth memory location, test pattern 00000001 is written to the ninth memory location.

The following table illustrates an exemplary walking zeros "0s" pattern that may be utilized for testing to the device under test.

| Mem. Loc. | Pattern |
| --- | --- |
| 1 | 11111110 |
| 2 | 11111101 |
| 3 | 11111011 |
| 4 | 11110111 |
| 5 | 11101111 |
| 6 | 11011111 |
| 7 | 10111111 |
| 8 | 01111111 |

In the walking zeros "0s" pattern a first memory location may be tested by writing test pattern 11111110 into the first memory location. A second memory location which is consecutive to the first memory location may be tested by writing test pattern 11111101 into the second memory location. A third memory location which is consecutive to the second memory location may be tested by writing test pattern 11111011. These patterns for testing successive memory locations as shown may be followed for successive patterns. When the eighth memory location is reached, test pattern 01111111 is written to the eighth memory location. The test patterns may then be repeated for successive memory locations. For example, for the ninth memory location, test pattern 11111110 is written to the ninth memory location.

Other test patterns that may be utilized for testing an embedded memory device under test may include, but are not limited to, writing the address of a specific location into that specific location, writing all ones and/or writing all zeros into every memory location and writing successive ones and zeros into each memory location of the embedded memory device under test.

Figure 3:
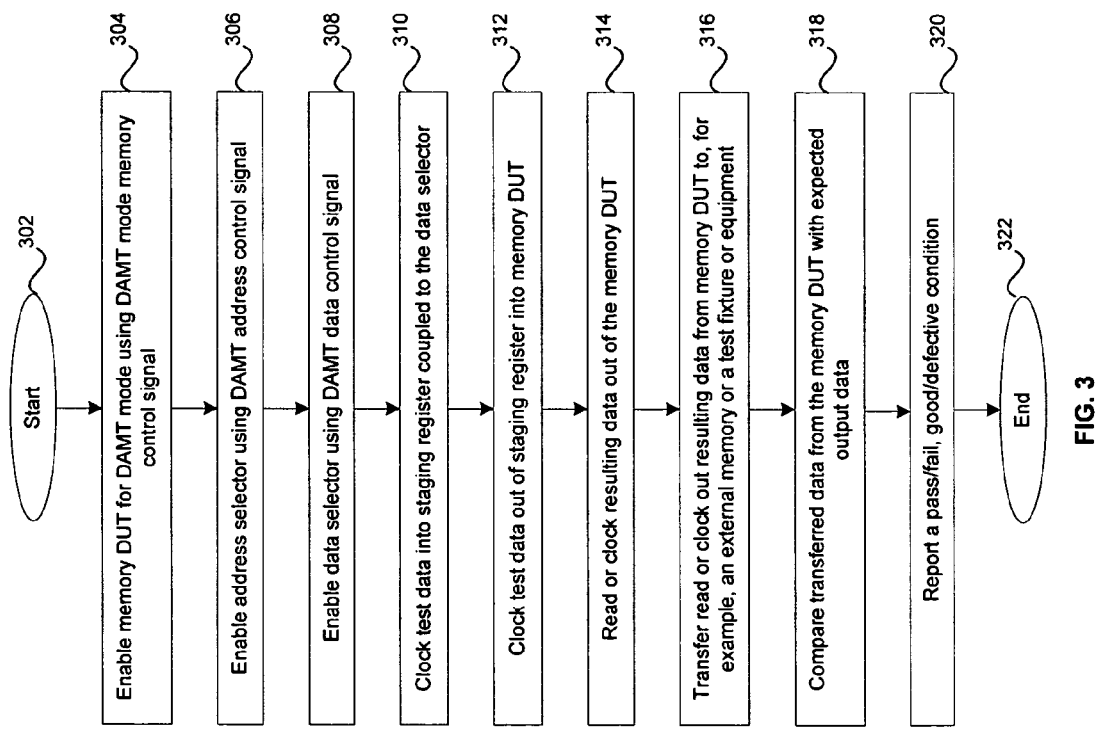
FIG. 3 is a flow diagram illustrating exemplary steps that may be utilized in connection with direct access memory testing in accordance with an embodiment of the invention.

FIG. 3 is a low diagram illustrating exemplary steps that may be utilized in connection with direct access memory testing in accordance with an embodiment of the invention. Referring to FIG. 1, the exemplary steps may start with step 302. Subsequently, in step 304, a memory device under test may be enabled for direct access memory testing using, for example, a direct access memory testing mode control signal. In step 306, an address selector may be enabled using, for example, a direct access memory testing address control signal. In step 308, a data selector may be enabled using a direct access memory testing data control signal.

In step 310, a test data may be clocked into a staging register coupled to the data selector. In step 312, the test data may be clocked out of the staging register into the memory device under test. In step 314, resulting data may be read or clocked out of the memory device under test. In step 316, the resulting data may be read and/or clocked out of the memory device under test and transferred to, for example, an external memory or a test fixture or equipment. In step 318, transferred data from the memory device under test may be compared with an expected output data. In step 320, at least a pass/fail or good/defective condition may be reported.

In accordance with an aspect of the invention, in the case of a fail or defective condition, an exact address of a failed memory location, if available, may be reported. Accordingly, in certain instances, a defective memory location may be disabled based on the reported failed or defective address.

Accordingly, the present invention may be realized in hardware, software, or a combination of hardware and software. The present invention may be realized in a centralized fashion in one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for testing an integrated circuit, the method comprising:
   configuring a memory device under test to operate in a direct access memory test mode, wherein said memory device under test is embedded within the integrated circuit;
   configuring an address selector to operate in said direct access memory test mode;
   configuring a data selector to operate in said direct access memory test mode; and
   clocking test data into a staging register at a first clock rate, and clocking corresponding test data from said staging register into said memory device under test at a second clock rate, wherein said first clock rate is greater than said second clock rate by a factor n, where n is a ratio of: a width of said test data clocked into said staging register at said first clock rate to a width of said corresponding test data clocked from said staging register at said second clock rate, and n is greater than 1.

2. The method according to claim 1, wherein said second clock rate is four times said first clock rate.

3. The method according to claim 1, further comprising transferring resulting test data out of said memory device under test for analysis.

4. The method according to claim 3, further comprising clocking said resulting test data out of said memory device under test at a rate that is a multiple of said first clock rate.

5. The method according to claim 3, further comprising comparing at least a portion of said resulting test data with at least a portion of expected test data.

6. The method according to claim 5, further comprising reporting a status of said memory device under test as being at least one of good, pass, defective and fail.

7. The method according to claim 1, further comprising mapping a limited number of external pins of a test device to a first corresponding data bus width of the integrated circuit with said embedded memory device under test during said direct access memory test mode.

8. The method according to claim 7, further comprising mapping at least a first portion of said limited number of external pins of said test device to a corresponding address bus width of the integrated circuit with said embedded memory device under test during said direct access memory test mode.

9. The method according to claim 8, further comprising mapping at least a second portion of said limited number of external pins of said test device to a second corresponding data bus width of the integrated circuit with said embedded memory device under test during said direct access memory test mode.

10. The method according to claim 7, further comprising configuring at least a first portion of said limited number of external pins of said test device as at least one of a data input, data output and data I/O pin.

11. The method according to claim 7, further comprising configuring at least a first portion of said limited number of external pins of said test device as at least one of a first clock signal and a second clock signal.

12. The method according to claim 1, wherein said second clock rate matches a burst frequency of said memory device under test.

13. The method according to claim 1, wherein n is equal to 2.

14. A system for testing an integrated circuit, the system comprising:
a signal generator that generates a signal that configures a memory device under test to operate in a direct access memory test mode, wherein said memory device under test is embedded within the integrated circuit;
an address selector configurable by said signal generator to operate in said direct access memory test mode;
a data selector configurable by said signal generator to operate in said direct access memory test mode; and
said signal generator clocks test data into a staging register at a first clock rate, and clocks corresponding test data from said staging register into said memory device under test at a second clock rate, wherein said first clock rate is greater than said second clock rate by a factor n, where n is a ratio of: a width of said test data clocked into said staging register at said first clock rate to a width of said corresponding test data clocked from said staging register at said second clock rate, and n is greater than 1.

15. The system according to claim 14, wherein said second clock rate is four times said first clock rate.

16. The system according to claim 14, wherein said signal generator generates at least one signal that transfers resulting test data out of said memory device under test for analysis.

17. The system according to claim 16, wherein said at least one signal generated by said signal generator clocks resulting test data out of said memory device under test at a rate that is a multiple of said first clock rate.

18. The system according to claim 16, further comprising at least one comparator that compares at least a portion of said resulting test data with at least a portion of expected test data.

19. The system according to claim 18, wherein said at least one comparator reports a status of said memory device under test as being at least one of good, pass, defective and fail.

20. The system according to claim 14, wherein said signal generator maps a limited number of external pins of a test device to a first corresponding data bus width of the integrated circuit with said embedded memory device under test during said direct access memory test mode.

21. The system according to claim 20, wherein said signal generator maps at least a first portion of said limited number of external pins of said test device to a corresponding address bus width of the integrated circuit with said embedded memory device under test during said direct access memory test mode.

22. The system according to claim 21, wherein said signal generator maps at least a second portion of said limited number of external pins of said test device to a second corresponding data bus width of the integrated circuit with said embedded memory device under test during said direct access memory test.

23. The system according to claim 20, wherein said signal generator configures at least a first portion of said limited number of external pins of said test device as at least one of a data input, data output and data I/O pin.

24. The system according to claim 20, wherein said signal generator configures at least a first portion of said limited number of external pins of said test device as at least one of a first clock signal and a second clock signal.

25. The system according to claim 14, wherein said clock rate matches a burst frequency of said memory device under test.

26. The system according to claim 14, wherein n is equal to 2.

27. A system for testing an integrated circuit, the system comprising:
an address selector coupled to at least one address pin and at least one control pin of a signal generator, said address selector having a direct access memory test mode address control input, and said address selector having at least one output address pin coupled to an embedded memory device under test;
a data selector coupled to at least one data pin and at least one control pin of said signal generator, said data selector having a direct access memory test mode data control input, and said data selector having at least one output data pin coupled to said embedded memory device under test; and
at least one staging register coupled to at least one input of said data selector, wherein test data is clocked into said at least one staging register at a first clock rate, and corresponding test data is clocked from said staging register into said embedded memory device under test at a second clock rate, wherein said first clock rate is greater than said second clock rate by a factor n, where n is a ratio of: a width of said test data clocked into said staging register at said first clock rate to a width of said corresponding test data clocked from said staging register at said second clock rate, and n is greater than 1.

28. The system according to claim 27, wherein said signal generator generates a direct access memory test mode control signal as an input to said embedded memory device under test and configures said embedded memory device under test to operate in said direct access memory test mode.

29. The system according to claim 28, wherein said signal generator generates at least a second clock signal to said embedded memory device under test and a first input clock signal to said at least one staging register, wherein a clock rate of said second clock signal matches a burst memory write frequency of said embedded memory device under test.

30. The system according to claim 29, wherein a clock rate of said first input clock signal is four times said clock rate of said second clock signal.

31. The system according to claim 27, further comprising a comparator that receives output test data from said embedded memory device under test and generates a status condition of said embedded memory device under test.

32. The system according to claim 27, wherein n is equal to 2.

* * * * *